United States Patent
Nikaido et al.

(10) Patent No.: US 7,765,444 B2
(45) Date of Patent: Jul. 27, 2010

(54) FAILURE DIAGNOSIS FOR LOGIC CIRCUITS

(75) Inventors: Masafumi Nikaido, Kawasaki (JP); Tomomi Ukai, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 345 days.

(21) Appl. No.: 11/934,800

(22) Filed: Nov. 5, 2007

(65) Prior Publication Data

US 2008/0109686 A1    May 8, 2008

(30) Foreign Application Priority Data

Nov. 6, 2006    (JP)    .............................. 2006-300044
Nov. 6, 2006    (JP)    .............................. 2006-300094

(51) Int. Cl.
    *G01R 31/28*    (2006.01)
(52) U.S. Cl. ..................................... 714/724
(58) Field of Classification Search ................. 714/723, 714/741, 724
    See application file for complete search history.

(56) References Cited

U.S. PATENT DOCUMENTS

| | | | |
|---|---|---|---|
| 6,136,618 A | 10/2000 | Sanada | |
| 6,185,707 B1 | 2/2001 | Smith et al. | |
| 6,553,329 B2 * | 4/2003 | Balachandran | 702/118 |
| 6,775,796 B2 * | 8/2004 | Finkler et al. | 714/723 |
| 6,799,130 B2 * | 9/2004 | Okabe et al. | 702/82 |
| 6,842,866 B2 * | 1/2005 | Song et al. | 714/37 |
| 7,071,833 B2 * | 7/2006 | Nagano et al. | 340/635 |
| 7,137,085 B1 * | 11/2006 | Wang et al. | 716/4 |
| 2007/0020781 A1 * | 1/2007 | Majima et al. | 438/14 |

FOREIGN PATENT DOCUMENTS

| | | |
|---|---|---|
| JP | 06-216207 | 8/1994 |
| JP | 8-146093 | 6/1996 |
| JP | 09-080117 | 3/1997 |
| JP | 09-114876 | 5/1997 |
| JP | 11-214465 | 8/1999 |
| JP | 2002-156418 | 5/2002 |
| JP | 2002-530659 | 9/2002 |
| JP | 2003-023056 | 1/2003 |
| JP | 2003-086689 | 3/2003 |
| JP | 2003-332449 | 11/2003 |
| JP | 2005-043274 | 2/2005 |
| JP | 2005-051061 | 2/2005 |
| JP | 2005-346596 | 12/2005 |
| JP | 2006-165091 | 6/2006 |
| JP | 2006-226639 | 8/2006 |

OTHER PUBLICATIONS

Japanese Patent Office issued a Japanese Office Action dated Apr. 10, 2009, Application No. 2006-300094.

* cited by examiner

*Primary Examiner*—James C Kerveros
(74) *Attorney, Agent, or Firm*—Young & Thompson

(57) ABSTRACT

A failure diagnosing method of logic circuits includes generating failure candidate data for logic circuits based on failure diagnosis data obtained from the logic circuits by using a failure diagnosis tool; and inputting the failure candidate data for the logic circuits. A predetermined data is extracted from each of the failure candidate data for the logic circuits. Failures of the logic circuits are diagnosed by collecting a name of each of the failure candidate data from the predetermined data and the number of failure candidate data; and the collected data are outputted on a display unit.

25 Claims, 15 Drawing Sheets

Fig. 3

```
<FAILURE CANDIDATE 1>, <BRANCH DATA 1>, <FAILURE TYPE 1>,
<NUMBER OF CANDIDATES/MULTIPLE CANDIDATES 1>
      <SEGMENT NAME 1-1>, <LAYER 1-1>, <COORDINATE 1-1>
      <SEGMENT NAME 1-2>, <LAYER 1-2>, <COORDINATE 1-2>
      ···(OMISSION)···
<FAILURE CANDIDATE 2>, <BRANCH DATA 2>, <FAILURE TYPE 2>,
      <NUMBER OF CANDIDATES/MULTIPLE CANDIDATES 2>
         ···(OMISSION)···
···(OMISSION)···
```

Fig. 4

| Cell | M1 | V12 | M2 | V23 | M3 | V34 | M4 |
|---|---|---|---|---|---|---|---|
| x10y11 | * | * | * | * | | | |
| x10y12 | | * | * | * | * | | |
| x11y22 | * | * | * | * | | | |
| x14y30 | | | * | * | * | * | * |
| x20y08 | | | * | * | * | | |
| x24y30 | | * | * | * | | | |

Fig. 5

| FAILURE CANDIDATE DATA | FAILURE TYPE | NO. OF CANDIDATES/ MULTIPLICATION |
|---|---|---|
| x10y11 | SINGLE | 1 |
| x12y20 | SINGLE | 90 |
| x22y03 | MULTIPLE | 3 |
| x28y33 | MULTIPLE | 2 |
| x30y06 | SINGLE | 3 |

Fig. 8

| | | |
|---|---|---|
| Net01 | 12 | x10y11, x10y12, x10y13, x10y18, x12y04, x11y06, x14y10, x14y11, x20y12, x20y14, x30y03, x33y22 |
| Net03 | 8 | x10y11, x10y12, x10y13, x10y18, x12y04, x11y06, x20y12, x20y14 |
| Net08 | 2 | x20y22, x20y14 |
| Net06 | 2 | x20y23, x20y14 |

Fig. 9

|  |  | x10y11 | x10y12 | x10y14 | x15y04 | x16y08 | x21y11 | x24y11 | x24y12 | x24y14 | x31y11 | x31y14 |
|---|---|---|---|---|---|---|---|---|---|---|---|---|
| Net01 | 10 | * | * | * | * | * | * | * | * | * | * | * |
| Net03 | 8 | * | * | * | * | * | * | * | * |  |  | * |
| Net08 | 2 |  |  |  |  |  |  | * | * | * |  |  |
| Net06 | 2 |  |  |  |  |  |  |  | * | * | * |  |

Fig. 12

| | | |
|---|---|---|
| VIA IN SPARSE ARRANGEMENT | | |
| Net01 | 12 | x10y11, x10y12, x10y13, x10y18, x12y04, x11y06, x14y10, x14y11, x20y12, x20y14, x30y03, x33y22 |
| Net06 | 2 | x20y12, x20y14 |
| VIA IN DENSE ARRANGEMENT | | |
| Net03 | 7 | x10y11, x10y12, x10y13, x10y18, x12y04, x11y06, x20y12 |
| Net08 | 2 | x20y12, x20y14 |
| Net06 | 2 | x20y12, x20y14 |

Fig. 14

```
#POSITION DATA OF CHIP
<POSITION DATA>;
#FAILURE CANDIDATE DATA
<FAILURE CANDIDATE NAME 1>, <LAYER 1>, <COORDINATE 1>;
<FAILURE CANDIDATE NAME 2>, <LAYER 2>, <COORDINATE 2>;
…(OMISSION)…
```

Fig. 15

```
#CHIP POSITION DATA DEFECT DATA (TEST PROCESS NAME, DEFECT COORDINATE, DEFECT IMAGE NAME)
<CHIP POSITION DATA 1>, <TEST PROCESS NAME 1>, <DEFECT COORDINATE 1>, <DEFECT IMAGE NAME 1>
<CHIP POSITION DATA 2>, <TEST PROCESS NAME 2>, <DEFECT COORDINATE 2>, <DEFECT IMAGE NAME 2>
<CHIP POSITION DATA 3>, <TEST PROCESS NAME 3>, <DEFECT COORDINATE 3>, <DEFECT IMAGE NAME 3>
...(OMISSION)...
```

Fig. 16

```
#PROCESS DATA
<TEST PROCESS NAME1>, <LAYER 1>;
<TEST PROCESS NAME2>, <LAYER 2>, <LAYER 3>;
<TEST PROCESS NAME3>, <LAYER 4>;
...(OMISSION)...
```

FAILURE DIAGNOSIS FOR LOGIC CIRCUITS

BACKGROUND OF THE INVENTION

1. Field of the Invention

The present invention relates to a failure diagnosing system for logic circuits. Japanese Patent Application Nos. JP2006-300044 and JP2006-300094 are related to this application. The disclosures of these applications are incorporated herein by reference.

2. Description of the Art

In failure diagnosis of logic circuits, a computer is used in which a logic circuit failure diagnosis program is installed. Necessary commands for desired failure diagnosis are inputted from an input unit to the computer to perform the failure diagnosis.

FIG. 1 is a flowchart of a failure portion estimating method for logic circuits in a related art. A failure simulator is used for failure diagnosis to logic circuits. First, at a step S101, an assumption is made on occurrence of a failure in the logic circuits and a functional simulation or logic simulation of the logic circuits is performed. Then, the simulation results are compared with expected results prepared in advance. An assumed position of the failure is related to input and output test vectors, and a combination of them is stored in a failure dictionary. Next, at a step S102, failure data is obtained from actual test results of the logic circuits. At a step S103, the failure dictionary is searched based on input and output vectors for a failure and an estimated failure is determined. Then, at a step S104, candidates of the estimated failure are ordered to estimate a failure portion.

In addition, as another method to specify a failure portion in logic circuits, a method is known which uses an electron beam tester to estimate a failure portion from the uppermost layer of the logic circuits while observing an internal signal in the interface between wiring layers, so that the failure portion is sequentially narrowed into a lower wiring layer of the logic circuits.

In conjunction with the above description, the following proposals have been made.

A Japanese Laid Open Patent Application (JP-A-Heisei B-146093) discloses a failure estimating method of a sequential circuit. In this technique in this related art, a semiconductor integrated circuit is divided into a group of latches and combination circuits to estimate a failure by using all expected values of all latches to all vectors, tester pass/failure data, and connection data of all circuits. The failure estimating method includes first to sixth procedures for every failure vector as processing procedures to determine failure propagation estimated values in the interface of the combination circuit, and finally, a failure estimation list is generated. Here, in the first procedure, combination circuits are extracted from an actual failure output pin or a latch input line estimated to be a failure to input pins of the semiconductor integrated circuit or a latch output in an input direction, and the combination circuits are further extracted from the input of the extracted combination circuits to output pins of the semiconductor integrated circuit or a latch input in an output direction. In the second procedure, a data flow is generated by checking whether or not the outputs of the latches connected to outputs of the combination circuits have affects to any other latches. In the third procedure, failure propagation values in an interface of the combination circuit are estimated and confirmed through a simulation to select a combination of simultaneous failure propagation possible signal lines, based on confirmation of single failure propagation, confirmation of branching in the same signal line and confirmation of branched signal activation in the combination circuit, and clock enable confirmation of latches in the interface. In the fourth procedure, the combination circuit is extracted in a rear direction if extraction of the circuit in the rear direction to the output of the actual semiconductor integrated circuit is not confirmed. In the fifth procedure, it is determined whether or not a result of the failure propagation simulation using the failure estimation results in the input interface of the combination circuit is consistent with an actual failure output. In the sixth procedure, a latch state estimation value table is generated if consistency is determined in the fifth procedure, and the presence or absence of degeneration failure is determined through the simulation result of the respective signal lines in the combination circuit using the latch state estimation value table in order to estimate failure portions in the combination circuits.

In a logic circuit manufacturing process, logic circuits are subjected to physical tests such as a visual test and electric tests by LSI testers for the purpose of improvement the yield of logic circuits. Although a physical failure of the logic circuit can be detected through the physical tests, the physical failure does not necessarily indicate abnormality of a logical operation. Moreover, it is impossible to determine where a failure portion exists in the logic circuit by simply applying electric test to the logic circuit.

Therefore, a technique to associate the physical failure with a logical failure is proposed in Japanese Laid Open Patent Applications (JP-A-Heisei 11-214465 and JP-P2002-530659A).

In the Japanese Laid Open Patent Application (JP-A-Heisei 11-214465), a diagnosis program is proposed to determine a failure portion by using a logic LSI as a monitor in a logic LSI manufacturing process. Electric characteristics of the logic circuit are measured, and if a concentric or rectangular region from the central coordinate of the visual failure obtained from a visual test of the logic circuit is consistent with the failure portion obtained from an electric test result, the failure results from the visual failure.

In Japanese Laid Open Patent Application (JP-P2002-530659A), a method is proposed to extract failure candidates of a logic circuit by using a diagnosis function of an ATPG (automatic test pattern generation) tool in order to compare the failure candidates with a physically abnormal portion obtained from an in-line test. A distance from the failure portion is specified by a user, and if the failure candidates are present within the specified radius, it is determined that the failure results from the visual abnormality.

The present inventors have recognized as follows. In order to improve a manufacture yield of a logic circuit, it is necessary to detect a failure observed in designing and manufacturing processes of the logic circuit. The conventional logic circuit failure diagnosing system allows a highly possible portion causing a logical abnormality to be narrowed in the level of circuit block or networks with respect to the logic circuit. It is further possible to obtain logic values of failure candidates and a failure pattern at the time of occurrence of the failure as auxiliary data. However, it is not necessarily possible to specify one failure candidate to a single network or instance by simply applying a simulation using logics and layouts, and a plurality of failure candidates are obtained in many cases. It is also difficult to systematically analyze defects, i.e. failures, observed in the designing and manufacturing processes only from diagnosis results of individual LSI.

Moreover, process abnormality is estimated by an engineer from a failure distribution within a wafer obtained from the visual test in a test process, and chips which are subjected to a failure diagnosis are selected by an engineer. However, even if the selected chips are analyzed, it is not necessarily possible to specify a failure cause which affects manufacturing quality, and a failure diagnosis needs to be carried out for multiple chips.

SUMMARY

The present invention solves the above problem by providing a technique to detect a failure common to logic circuits in a same production lot or in a same portion of wafer between different lots.

In a first aspect of the present invention, a failure diagnosing method of logic circuits is achieved by (a) generating failure candidate data for logic circuits based on failure diagnosis data obtained from the logic circuits by using a failure diagnosis tool; by (b) inputting the failure candidate data for the logic circuits; by (c) extracting a predetermined data from each of the failure candidate data for the logic circuits; by (d) diagnosing failures of the logic circuits by collecting a name of each of the failure candidate data from the predetermined data and the number of failure candidate data; and by (e) outputting the collected data on a display unit.

In a second aspect of the present invention, a computer readable recording medium is provided in which a program is stored to realize a failure diagnosing method. In the failure diagnosing method, failure candidate data for logic circuits are generated based on failure diagnosis data obtained from the logic circuits, and the failure candidate data for the logic circuits are inputted. Also, a predetermined data is extracted from each of the failure candidate data for the logic circuits; and failures of the logic circuits are diagnosed by collecting a name of each of the failure candidate data from the predetermined data and the number of failure candidate data. The collected data are outputted on a display unit.

In a third aspect of the present invention, a failure diagnosing method of logic circuits, is achieved by (a) generating failure candidate data for logic circuits based on failure diagnosis data obtained from the logic circuits by using a failure diagnosis tool; by (b) inputting the failure candidate data for the logic circuits; by (c) extracting a predetermined data from each of the failure candidate data for the logic circuits; by (d) diagnosing failures of the logic circuits; and by (e) outputting data on a display unit. The (c) extracting includes (c-1) extracting a failure candidate name and a coordinate of the failure candidate, a failure candidate layer of a layout wiring layer or manufacturing processes, a failure candidate wiring branch data from the failure candidate data for each of the logic circuits. The (d) diagnosing includes (d-1) extracting an OPEN failure candidate layer as a layer of the failure occurring due to disconnection from the failure candidate data by using said failure candidate layer, and (d-2) extracting an SHORT failure candidate layer as a layer of the failure occurring due to short-circuit from the failure candidate data by using said failure candidate layer. The (e) outputting includes (e-1) outputting the OPEN candidate layer and the SHORT candidate layer for each of the failure candidate data; and (e-2) outputting a failure type, and the number of failure candidates or the number of overlapping failures.

In a fourth aspect of the present invention, a computer readable software product is provided in which a program is stored for realizing a failure diagnosing method. The failure diagnosing method includes (a) generating failure candidate data for logic circuits based on failure diagnosis data obtained from the logic circuits by using a failure diagnosis tool; (b) inputting the failure candidate data for the logic circuits; (c) extracting a predetermined data from each of the failure candidate data for the logic circuits; (d) diagnosing failures of the logic circuits; and (e) outputting data on a display unit. The (c) extracting includes (c-1) extracting a failure candidate name and a coordinate of the failure candidate, a failure candidate layer of a layout wiring layer or manufacturing processes, a failure candidate wiring branch data from the failure candidate data for each of the logic circuits. The (d) diagnosing includes (d-1) extracting an OPEN failure candidate layer as a layer of the failure occurring due to disconnection from the failure candidate data by using said failure candidate layer; and (d-2) extracting an SHORT failure candidate layer as a layer of the failure occurring due to short-circuit from the failure candidate data by using said failure candidate layer. The (e) outputting includes (e-1) outputting the OPEN candidate layer and the SHORT candidate layer for each of the failure candidate data; and (e-2) outputting a failure type, and the number of failure candidates or the number of overlapping failures.

According to the present invention, it is made possible to provide a failure diagnosing system for logic circuits in order to extract highly possible failure candidates and failure candidate layers causing logical abnormalities common to the logic circuits, a via density of failure candidates, the number of failure candidates, and consistency or inconsistency to physical defects.

BRIEF DESCRIPTION OF THE DRAWINGS

The above and other objects, advantages and features of the present invention will be more apparent from the following description of certain embodiments taken in conjunction with the accompanying drawings, in which:

FIG. 3 is a diagram showing an example of failure candidate data;

FIG. 4 is a diagram showing an example of output data;

FIG. 5 is a diagram showing another example of output data;

FIG. 8 is a diagram showing an example of collecting and totalizing failure candidate names and the number of failure candidate for each network name with respect to networks of the failure candidate data;

FIG. 9 is a diagram showing an example of collecting and totalizing the failure candidate data names and the number of failure candidate data for each network name in networks within the failure candidate data;

FIG. 12 is a diagram showing an example of output results;

FIG. 14 is a diagram showing an example of failure candidate data;

FIG. 15 is a diagram showing an example of test data;

FIG. 16 shows an example of process parameters; and

DESCRIPTION OF THE PREFERRED EMBODIMENTS

Hereinafter, a failure diagnosing system of the present invention will be described with reference to the attached drawings. The failure diagnosing system of the present invention is realized by a computer system with an input unit and an output unit such as a display unit, and a storage unit storing a program which is executed by a computer. During the execution, various functions are attained.

Figure 1:
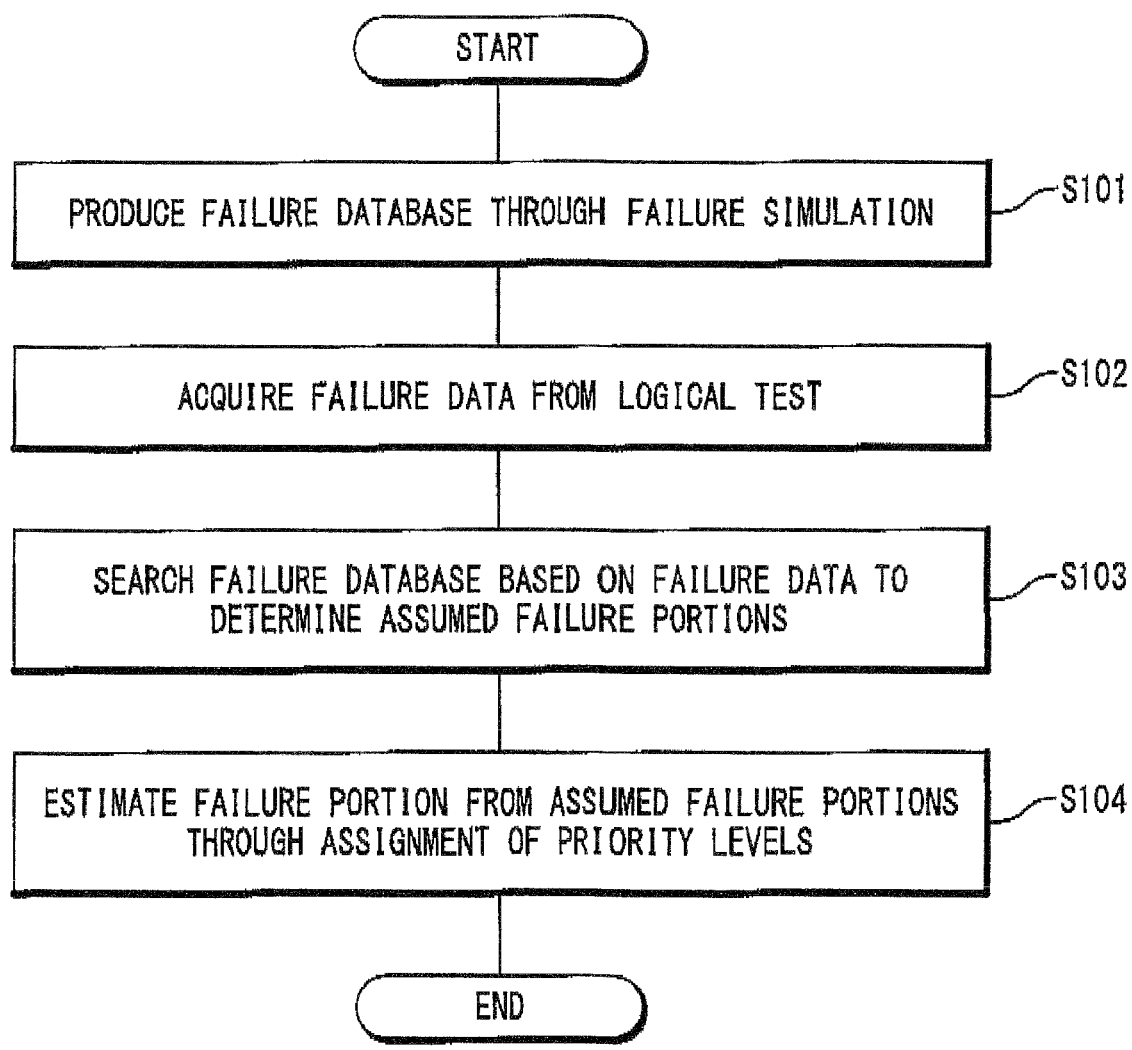
FIG. 1 is a flowchart showing a process procedure of a logic circuit failure portion estimation method according to a conventional technique.
Figure 2:
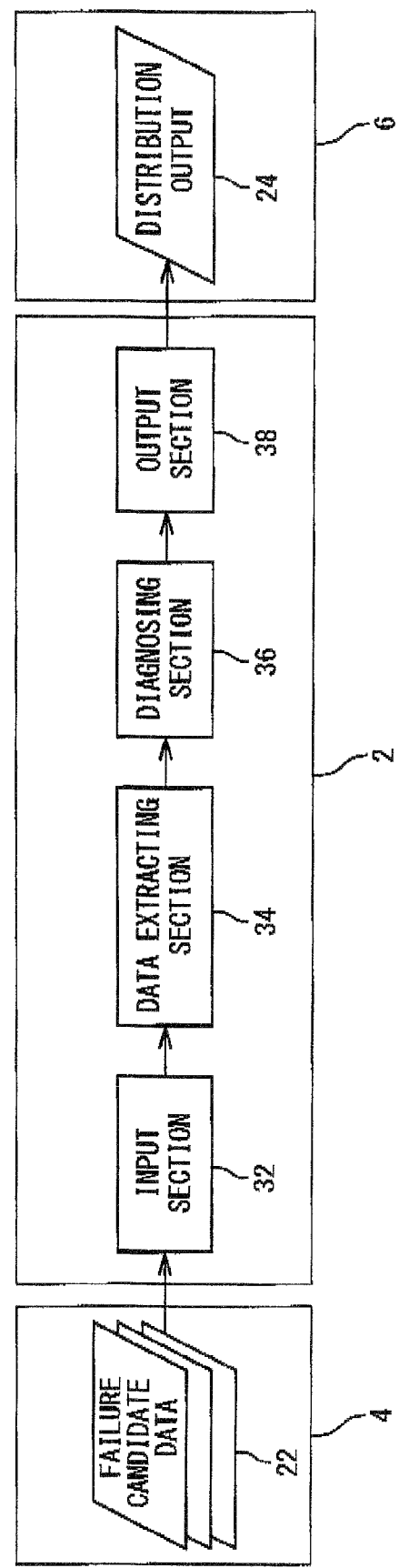
FIG. 2 is a functional block diagram showing a functional configuration of the failure diagnosing system according to a first embodiment of the present invention.

FIG. 2 is a functional block diagram showing a functional configuration of the failure diagnosing system according to a first embodiment of the present invention. In the failure diagnosing system according to the first embodiment of the present invention, failure portions of a logic circuit are estimated on the basis of failure candidate data obtained from test results of the logic circuits. The failure diagnosing system in the first embodiment includes a storage unit 4 storing failure candidate data, a processing section 2 and an output unit 6 for displaying a distribution output. The processing section 2 is realized by a computer executing a program stored in the storage unit 4. The processing section 2 includes an input section 32 executing an input process, a data extracting section 34 executing a data extracting process, a diagnosing section 36 executing a diagnosing process, and an output section 38 executing an output process.

In the input process by the input section 32, data of failure candidates obtained from logic circuits of a semiconductor circuit chip as a diagnosis target by using a failure diagnosis tool are inputted. Thus, the data extracting section acquires these data. The failure diagnosis tool used here may be any tool in general use.

In the data extracting process by the data extracting section, a name of each of the failure candidates and a failure candidate layer including one of wiring layers for the logic circuits and/or a manufacturing or testing process are detected and extracted from each of the failure candidate data. A failure type is detected and extracted from each of the failure candidate data. The failure type is classified into a single failure type that a single failure occurs in the single logic circuit, and a multiple failure type that a plurality of failures occur in the single logic circuit. Moreover, the number of failure candidates is detected and extracted in case of the single failure type, while the number of failures is detected and extracted in case of the multiple failure type.

In the diagnosing process by a diagnosing section, an OPEN candidate layer and a SHORT candidate layer are detected and extracted from the failure candidate layer for each of the failure candidate data. The OPEN candidate layer is a layer of an OPEN failure candidate in which a failure cause in the logic circuit is suspected to be disconnection. The SHORT candidate layer is a layer of a SHORT failure candidate in which a failures cause in the logic circuit is suspected to be short-circuited.

In the output process by the output section, a failure candidate distribution data of the OPEN candidates and the SHORT candidates is outputted.

As for a layer having a high possibility of causing a logical abnormality common to the logic circuits, the OPEN failure candidates and the SHORT failure candidates are classified and outputted, so that it is made easier to trace a failure cause. Moreover, the failure type and the number of failure candidates or the number of multiple failure candidates are outputted for each failure candidate data, so that it is made easier to determine the failure cause of each logic circuit since the failure candidates are narrowed down for each failure type. Accordingly, it is made easier to select one of the logic circuits to be subjected to a detailed analysis in order to specify a failure cause.

FIG. 3 is a diagram showing an example of failure candidate data. Each of the failure candidate data has the failure candidate name for the logic circuit and is described as a list. Each failure candidate name is provided with the list of a branch data, the failure type, the number of failure candidates or multiple failure candidates, segments and layers of the failure candidate, and coordinates thereof.

FIG. 4 is a diagram showing an example of output data. Here, x10y11 and x10y12 are the failure candidate names or logic circuit names, and Cell, M1 and V12 are names of the failure candidate layers. A distribution diagram in which the respective failure candidate layers are marked for each failure candidate name (or logic circuit name) are generated for each of the OPEN candidate layer and the SHORT candidate layer.

In a modification of the first embodiment of the failure diagnosing system for the logic circuits according to the present invention, the following process is executed. In the data extracting process by the data extracting section, a failure candidate name, failure candidate coordinates, a failure candidate layer containing one or more of wiring layout layers of the logic circuit or a manufacturing or testing process, and a wiring branch data of the failure candidate are detected and extracted from the failure candidate data for each logic circuit.

In the diagnosing process by the diagnosing section, either the OPEN candidate layers or the SHORT candidate layers or both of them are detected and extracted from the failure candidate layer and the wiring branch data for every failure candidate data. That is, if the failure candidate indicates the entire wiring, the wiring layer containing the wiring is detected and extracted as an OPEN candidate layer or a SHORT candidate layer. If the failure candidate is a part of the wiring, the wiring layer containing the wiring part is detected and extracted as the OPEN candidate layer. If the failure candidate is a pair of wirings, the wiring layer adjacent to the both wirings is detected and detected and detected and extracted as the SHORT candidate layer. If the failure candidate is a cell, the cell is detected and extracted as the OPEN candidate layer or the SHORT candidate layer. If the failure candidate is a gate, the gate is detected and extracted as the OPEN candidate layer or the SHORT candidate layer.

Therefore, even if it is unknown whether the failure candidate is an OPEN-type failure or a SHORT-type failure, the OPEN-type failure and the SHOT-type failure are respectively assumed from the failure diagnosis results in each logic circuit, so that a distribution of a highly possible layer causing logical abnormality can be acquired. Thus, it is made easier to trace the failure cause.

FIG. 5 is a diagram showing another example of output data. Here, the failure type of the failure candidate data x10y11 is a single failure type and the number of failure candidates is 1. The failure type of the failure candidate data x12y20 is a single failure type and the number of failure candidates is 90. The failure type of the failure candidate data x22y03 is a multiple failure type and the number of multiple failure candidates is 3. The failure type of the failure candidate data x28y33 is a multiple failure type and the number of multiple failure candidates is 2. The failure type of the failure candidate data x30y06 is a single failure type and the number of failure candidates is 3.

Figure 6:
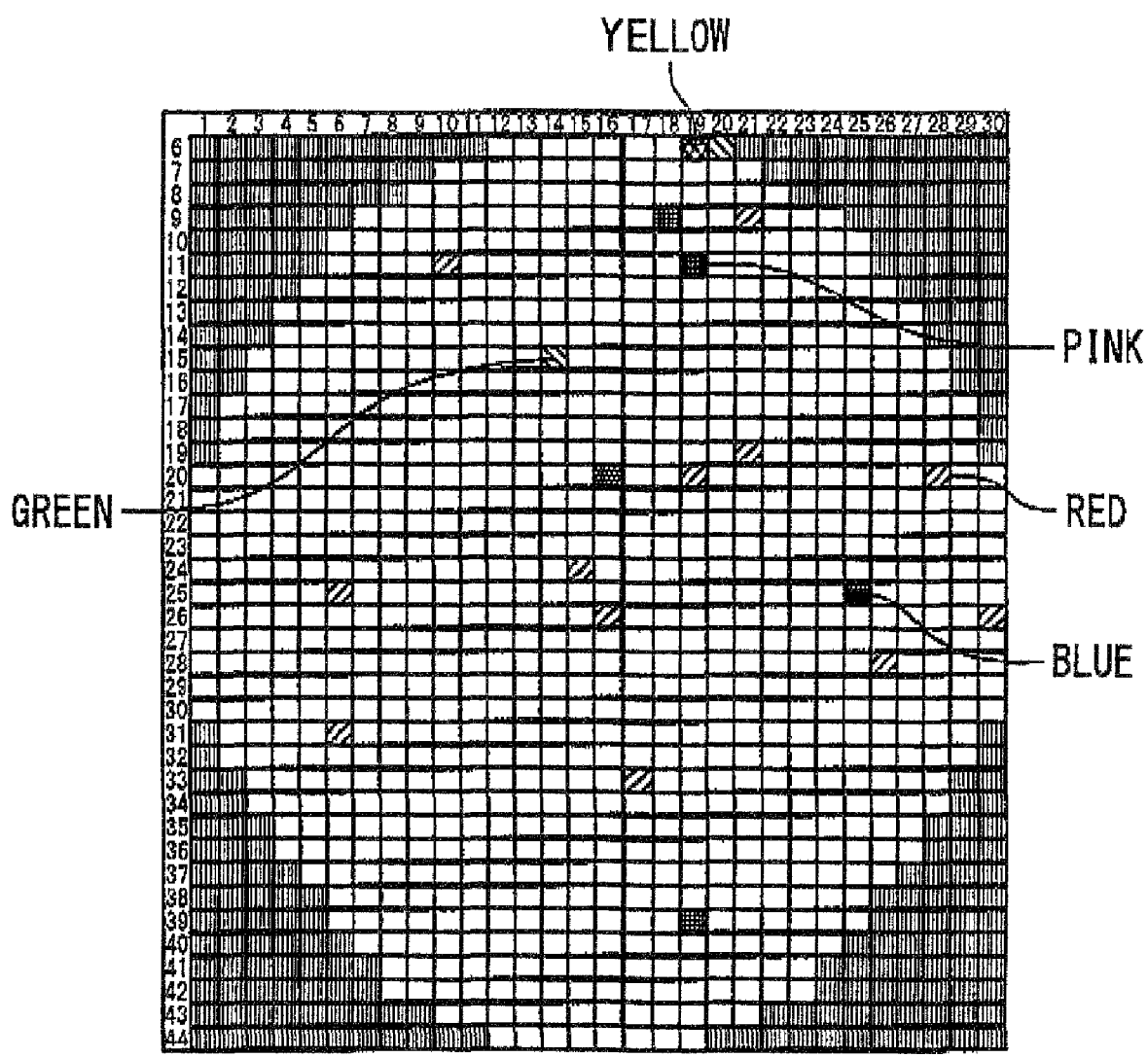
FIG. 6 is a diagram showing an example of color display of the failure diagnosis results on physical positions of a wafer as a chip image.

FIG. 6 is a diagram showing an example of color display of the failure diagnosis results on physical positions of a wafer of the logic circuit chips. In a modification of the failure diagnosing system for the logic circuits according to the present invention, the failure candidate data of each of the logic circuits of a same product kind but a different circuit are inputted in the input process. The failure candidate data include physical position data of the logic circuit at the time of manufacturing. In an example of FIG. 6, the position data of the logic circuit is expressed by the failure candidate name such as x10y11. Physical positions of the logic circuits on the wafer at the time of manufacturing are expressed by a chip arrangement matrix. For example, x10y11 means that a logic circuit is positioned on row 10 by column 11. Display colors of respective logic circuits depend on the failure type and the number of failure candidates or multiple failure candidates in the failure candidate data corresponding to the logic circuit. Therefore, a distribution diagram is obtained to indicate a physical position of a failure on the wafer containing a chip of the logic circuit. In the output process by the output section, the failure types and the number of failure candidates or multiple failure candidates for each logic circuit are outputted and displayed in different colors on physical positions of the wafer of logic circuit chips. In this way, it is made easier to select one of the logic circuits to be subjected to a detailed analysis in order to specify a failure cause such as manufacturing variation, by using a distribution of physical positions of logic circuits obtained by narrowing the failure candidates for each failure type, and a distribution of physical positions of other logic circuits. It should be noted that the display colors may be different for the purpose of easy visual recognition, and shapes, patterns, characters and numerical values may be alternatively used or may be used in combination with colors to display failures without limiting a display method to color differentiation.

Figure 7:
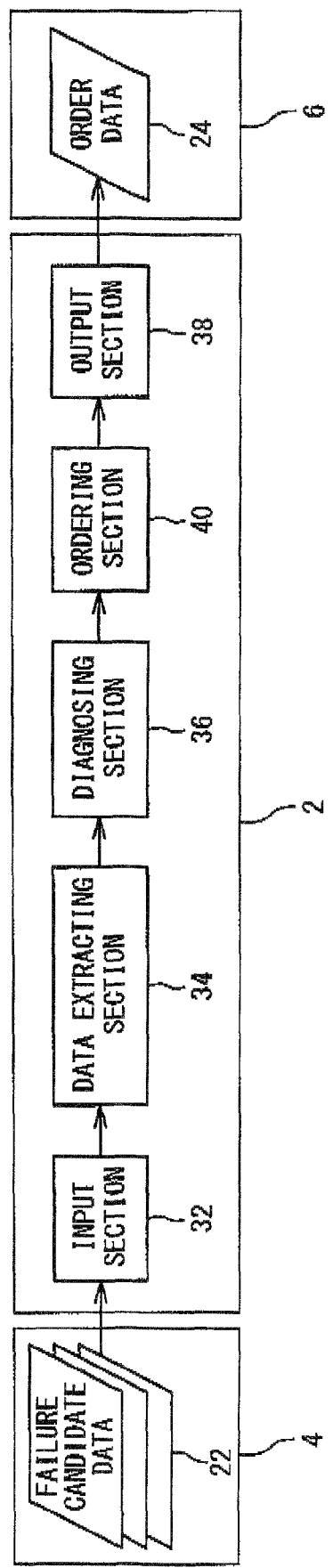
FIG. 7 is a functional block diagram of the failure diagnosing system for logic circuits according to a second embodiment of the present invention.

FIG. 7 is a functional block diagram of the failure diagnosing system for logic circuits according to a second embodiment of the present invention. The failure diagnosing system for the logic circuits according to the second embodiment of the present invention estimates a failure portion of the logic circuits on the basis of the failure candidate data obtained from test results of the logic circuits. The failure diagnosing system in the second embodiment includes the storage unit 4 storing failure candidate data, a processing section 2 and an output unit 6 for displaying an order data. The processing section 2 includes the input section 32 executing the input process, the data extracting section 34 executing the data extracting process, the diagnosing section 36 executing the diagnosing process, an ordering section 40 executing an ordering process, and the output section 38 executing the output process.

In the input process by the input section, the failure candidate data obtained by a failure diagnosis tool for each logic circuit are inputted. The failure diagnosis tool used here may be any tool in general use.

In the data extracting process by the data extracting section, a failure candidate name and a failure candidate layer containing a wiring layout layer or a manufacturing or testing process is detected and extracted from the failure candidate data for each logic circuit. In the diagnosing process by the diagnosing section, a layer of OPEN failure candidates is detected and extracted as the OPEN candidate layer and a layer of SHORT failure candidates is detected and extracted as the SHORT candidate layer from the failure candidate layer for every failure candidate data. In the ordering process by the ordering section, the number of layers is counted for every OPEN candidate layer and for every SHORT candidate layer with respect to the failure candidate data for entire logic circuits. The failure candidates are sequentially ordered from the OPEN failure candidate of the maximum count, and similarly are sequentially ordered from the SHORT failure candidate of the maximum count. In the output process by the output section, the failure candidate names and sequential orders of OPEN failure candidates and the failure candidate names and sequential orders of the SHORT failure candidates are outputted for each failure candidate data. Therefore, a layer in which a failure is caused in common to the logic circuits is first subjected to an analysis in a descending order. Thus, it is made easier to trace the failure cause.

Moreover, in the failure diagnosing system for the logic circuits according to a modification of the second embodiment of the present invention, the following operation is accomplished. In the data extracting process by the data extracting section, the failure candidate name, the failure candidate coordinates, a failure candidate layer containing a wiring layout layer or a manufacturing or testing process, and a wiring branch data of the failure candidate are detected and extracted from the failure candidate data for each logic circuit. In the diagnosing process by the diagnosing section, a layer of OPEN failure candidates is detected and extracted as the OPEN candidate layer and a layer of SHORT failure candidates is detected and extracted as the SHORT candidate layer from the failure candidate layer and the wiring branch data of the failure candidates for every failure candidate data. Similarly, if the failure candidate is a part of the wiring, the wiring layer containing the wiring part is detected and extracted as the OPEN candidate layer. If the failure candidate is a pair of wirings, the wiring layer adjacent to the both wirings is detected and extracted as the SHORT candidate layer. If the failure candidate is a cell, the cell is detected and extracted as the OPEN candidate layer or the SHORT candidate layer. If the failure candidate is a gate, the gate is detected and extracted as the OPEN candidate layer or the SHORT candidate layer. Therefore, even if it is unknown whether a failure candidate is an OPEN-type failure or a SHORT-type failure, the OPEN-type failure and the SHORT-type failure are respectively assumed from failure diagnosis results for each logic circuit. Thus, a distribution of highly possible layers causing logical abnormality can be obtained and it is made easier to trace the failure cause by carrying out the analysis in a descending order from the layer having the highest commonality.

FIGS. 8, 9, 10 and 11 are diagrams showing examples of output results, respectively. FIG. 8 is the diagram showing an example of collecting and totalizing failure candidate names and the number of failure candidate for each network name with respect to networks of the failure candidate data. In a failure candidate network Net01 as the failure candidate, the failure candidate data names are x10y11, x10y12, x10y13, x10y18, x12y04, x11y06, x14y10, x14y11, x20y12, x20y14, x30y03, and x33y22, and the number of failure candidate data is 12.

FIG. 9 is the diagram showing an example of collecting and totalizing the failure candidate data names and the number of failure candidate data for each network name in networks within the failure candidate data. The lateral axis indicates the failure candidate names, and the Net01 is the failure candidate, and the failure candidate names whose columns are marked. When the Net01 is the failure candidate, 10 failure candidate data names are contained such as x10y11, x10y12, x10y14, x15y04, x16y08, x21y11, x24y11, x24y12, x31y11, and x31y14.

As another output process by the output section, when item values set as the failure candidates from the results totalized in the diagnosing process in the failure candidate data are displayed in highlight display on a layout design data of logic circuits. In this case, the display colors are different based on the number of failure candidate data of the item values. Therefore, the failure candidate common to the logic circuits can be confirmed on a logic circuit layout image, and it is made easier to determine portions to be observed at the time of analysis.

Figure 10:
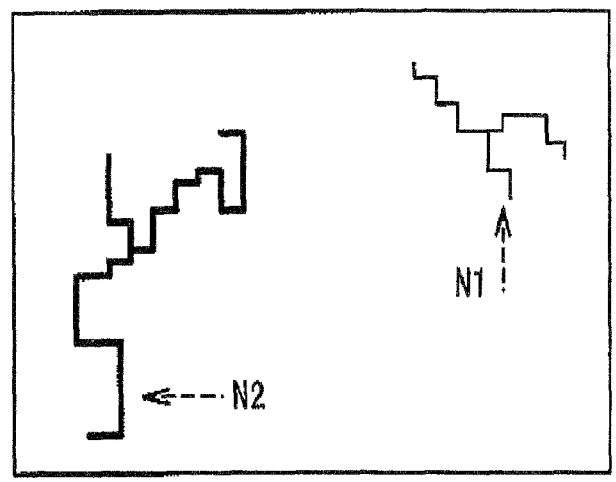
FIG. 10 is a diagram showing an example of displaying the failure candidates including a failure candidate network N1 and a failure candidate network N2 in different highlight colors based on the number of failure candidate data.

FIG. 10 is the diagram showing an example of displaying the failure candidates including a failure candidate network N1 and a failure candidate network N2 in different highlight colors based on the number of failure candidate data.

In yet another output process, item values of the failure candidate data set as the failure candidates are determined from the results collected and totalized in the diagnosing process and the determined item values are displayed on a layout design data image in different colors determined based on the numbers of failure candidate data on the items. The display image is displayed to overlap on an image obtained from an analysis apparatus or test apparatus. Therefore, it is made possible to obtain correspondence between highly possible portions causing logical abnormality common to the logic circuits and physical images, and it is made easier to specify the failure cause.

Figure 11:
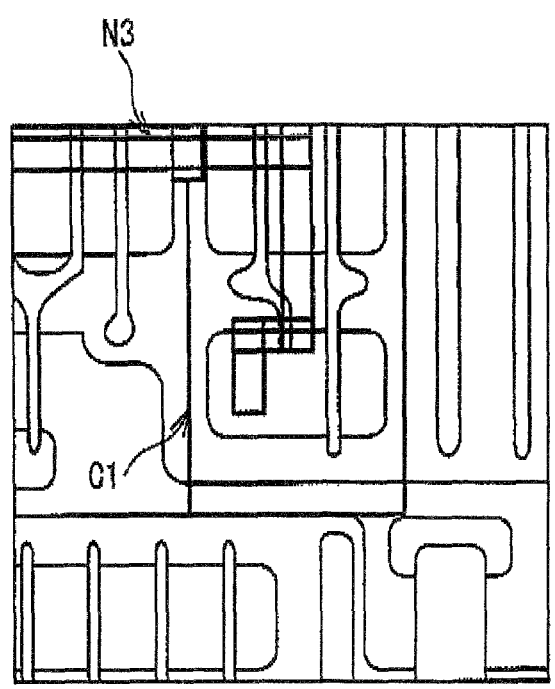
FIG. 11 is a diagram showing an example of using a layout design data image to display images of a network and a cell as failure candidates in the failure candidate data.

FIG. 11 is the diagram showing an example of using a layout design data image to display images of a network N3 and a cell C1 as failure candidates in the failure candidate data, and the images of the network N3 and the cell C1 are displayed on the layout design data image in different colors determined based on the number of failure candidate data in which the network N3 and the cell C1 are set as failure candidates to overlap with an image obtained from the test apparatus.

In a modification embodiment of the failure diagnosing system for the logic circuits according to the second embodiment of the present invention, the following processes are executed. In the data extracting process by the data extracting section, the failure candidate network name is detected and extracted from the failure candidate data of each logic circuit by setting network name as a target item. Also, the via sparse/dense data is detected and extracted to indicate whether the via arrangement is sparse or dense in the failure candidate network.

In the diagnosing process by the diagnosing section, the failure candidate networks are classified based on the via density data, to collect and totalize the failure candidate data names and the number of failure candidate data for each failure candidate name. Therefore, sparse or dense via arrangement can be easily recognized in the failure candidate networks causing a failure common to the logic circuits, so that it is made easier to trace the failure cause associated with the vias.

FIG. 12 is a diagram showing an example of output results. Networks set as the failure candidates in the failure candidate data are Net01, Net03, Net06, and Net08, and the networks Net01 and Net08 are indicated to have sparsely arranged vias. The networks Net03, Net06 and Net08 are indicated to have densely arranged vias. In the failure candidate network Net08, the failure candidate data names having Net08 as the failure candidate include x20y12 and x20y14, and the number of failure candidate data is 2.

In another modification of the output process by the output section, the failure candidate network name set as the failure candidate in the failure candidate data is displayed in a highlight display on the layout design data image of the logic circuits from the results collected and totalized in the diagnosing process. The failure candidate networks are displayed in different colors based on the via dense/sparse data. Thus, it is made possible to confirm whether the vias of the failure candidate network in which a failure is caused in common to the logic circuits are sparse or dense, on a logic circuit layout, resulting in easier to determine portions to observe at the time of analyses.

FIG. 10 shows the example in which the network N1 has portions with the sparse via arrangement and the network N2 does not have portions with the sparse via arrangement. The network N2 is displayed on the layout design data in a highlight display in a color determined based on the via dense/sparse data.

In a still another modification of the failure diagnosing system for the logic circuits according to the second embodiment of the present invention, the following processes are executed. In the input process, the failure candidate data of different logic circuits of the same kind are inputted. The failure candidate data includes physical position data of the logic circuits at the time of manufacturing. In the output process by the output section, the number of failure candidate data is counted for each item value and outputted to display on the physical positions of a logic circuit image in different colors based on the count value. Therefore, the failure candidate causing a failure common to the logic circuits can be obtained as a distribution of physical positions of the logic circuits, so that it is made easier to trace the failure cause such as a manufacturing variation.

FIG. 8 is a diagram showing an example of the results of counting the number of failure candidate data for each failure candidate network name. In this case, the failure network Net01 contains the failure candidate composed of 12 failure candidates of x10y11, x10y12, x10y13, x10y18, x12y04, x11y06, x14y10, x14y11, x20y12, x20y14, x30y03 and x33y22. The failure candidate network Net03 contains a failure candidate composed of 8 failure candidate data of x10y11, x10y12, x10y13, x10y18, x12y04, x11y06, x20y12 and x20y14. The failure candidate network Net08 contains a failure candidate of 2 failure candidate data of x20y12 and x20y14. The failure candidate network Net06 contains a failure candidate composed of 2 failure candidate data of x20y12 and x20y14. In this example, the physical position data of the logic circuits at the time of manufacturing are expressed by failure candidate data names such as x10y11. The physical positions of the logic circuits at the time of manufacturing are expressed by a chip arrangement matrix. The position data x10y11 means that the logic circuit is positioned on row 10 by column 11. As for the logic circuit x10y11, the failure candidate network Net01 has a maximum value of the number of failure candidate data and the value is 12. Similarly, as for the logic circuits x10y12, x10y13, x10y18, x12y04, x11y06, x14y10, x14y11, x20y12, x20y14, x30y03, and x33y22, the failure candidate network Net01 has a maximum value of the failure candidate data and the value is 12. As for the logic circuit x20y22, the failure candidate network Net08 has a maximum value of the number of failure candidate data and the value is 2. As for the logic circuit x20y23, the failure candidate network Net06 has a maximum value of the number of failure candidate data and the value is 2. Here, the logic circuits x10y11, x10y12, x10y13, x10y18, x12y04, x11y06, x14y10, x14y11, x20y12, x20y14, x30y03 and x33y22 having a maximum value of 12 in the number of failure candidate data are displayed in a color different from that of the logic circuits x20y22 and x20y23 having a maximum value of 2 in the number of failure candidate data.

FIG. 6 shows an example of outputting and displaying the logic circuits on the physical positions in different colors by using data different from the aforementioned data.

Figure 13:
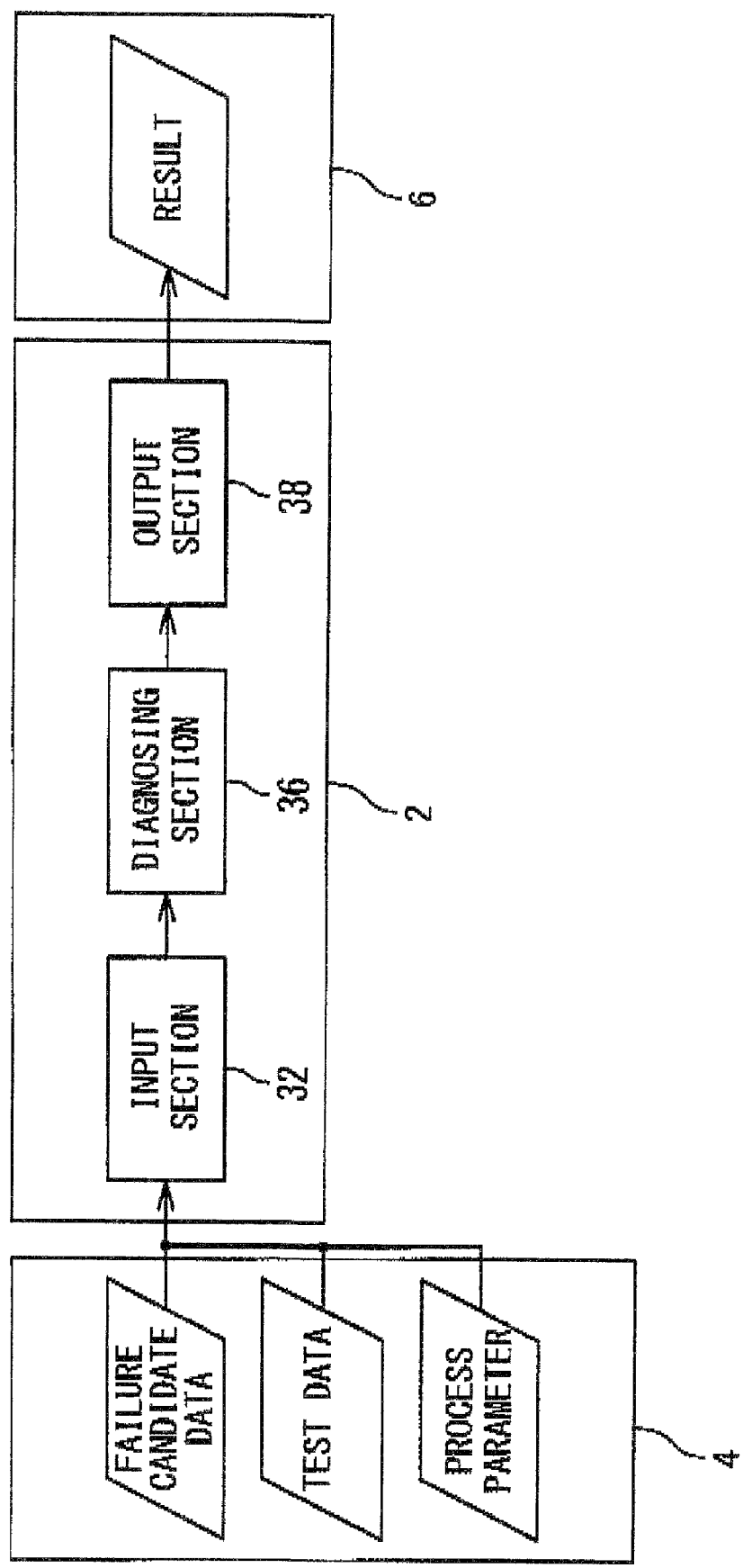
FIG. 13 is a function block diagram showing a configuration of the failure diagnosing system for the logic circuits according to a third embodiment of the present invention.

FIG. 13 is a function block diagram showing a configuration of the failure diagnosing system for the logic circuits according to a third embodiment of the present invention.

The failure diagnosing system for the logic circuits according to the third embodiment of the present invention estimates failure portions of the logic circuits on the basis of failure data obtained from test results of the logic circuits. The failure diagnosing system in the third embodiment includes a storage unit 4 storing failure candidate data, a test data and a process parameter, a processing section 2 and an output unit 6 for displaying a result. The processing section 2 includes the input section 32 executing the input process, the diagnosing section 36 executing the diagnosing process, and the output section 38 executing the output process. In the input process here, failure candidate data, test data and process parameters are inputted.

FIG. 14 is a diagram showing an example of failure candidate data. The failure candidate data is data of failure candidates in each logic circuit obtained from a failure diagnosis tool. The failure candidate data includes positional data of chips at the time of manufacturing, failure candidate names, and failure candidate information of failure candidate coordinates and failure candidate layers. The failure diagnosis tool used here may be any tool in general use.

FIG. 15 is a diagram showing an example of test data. The test data has data of physical defects obtained from a test apparatus. This test data includes position data of the chips at the time of manufacturing, defect data composed of test process names and defect coordinates to identify defect positions within chips, and defect images. Process parameters include failure candidate layers of failure candidate data, and test process names of test data corresponding to failure candidate layers.

FIG. 16 shows an example of process parameters. In the example of FIG. 11, a failure candidate layer corresponding to a test process name 1 is a failure candidate layer 1. Fault candidate layers corresponding to a test process name 2 are a failure candidate layer 2 and a failure candidate layer 3.

In the diagnosing process by the diagnosing section, defect shapes are converted into polygonal regions from the defect images, and the coordinates of the polygonal regions are obtained by using the coordinates of the defect shapes. The failure candidate data, the test data and the process parameter are referred to, and the coordinates of failure candidates as failure candidate layers corresponding to the test process names are compared with the coordinates of the polygonal regions in order to determine whether or not regions defined based on these coordinates are overlapped.

Figure 17:
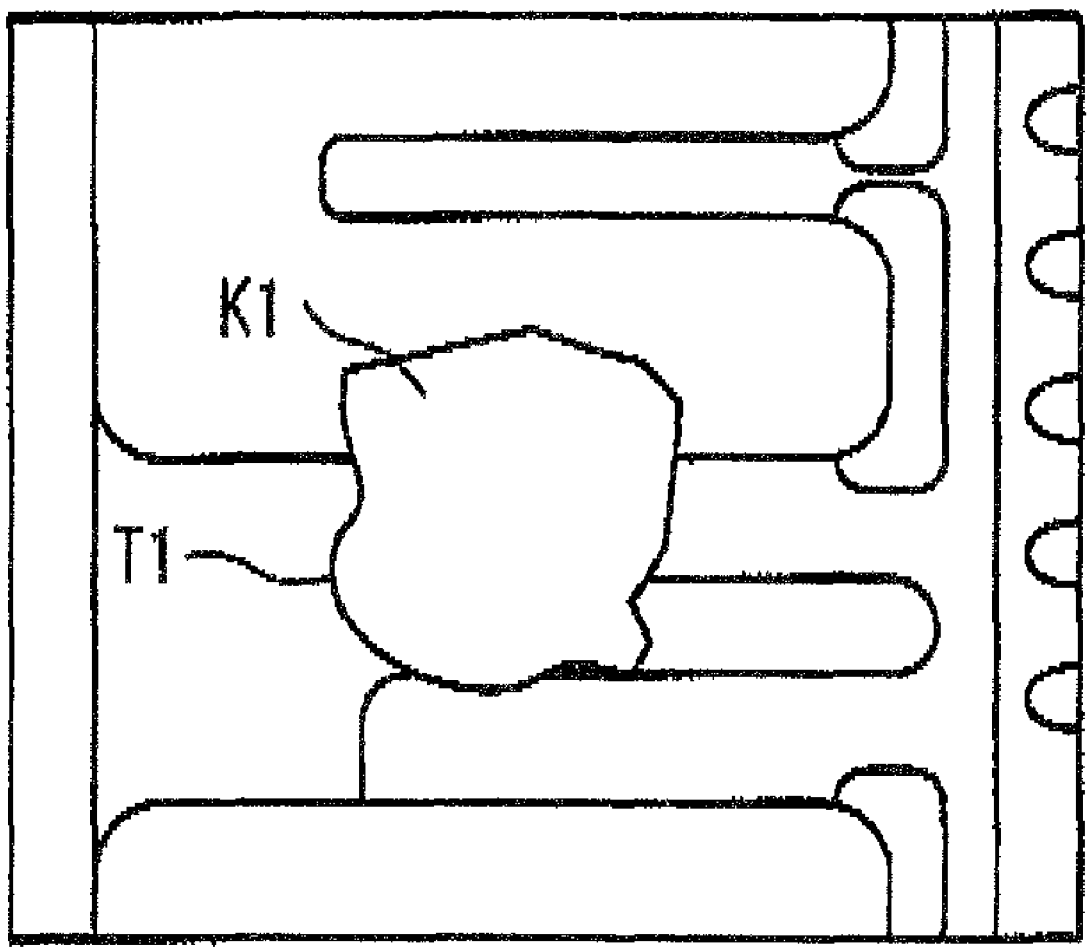
FIG. 17 is a diagram showing an example of converting a physical defect into a polygonal region.

FIG. 17 is a diagram showing an example of converting a physical defect K1 into a polygonal region T1. The coordinates of the polygonal region T1 are compared with the coordinates of failure candidates in order to determine whether or not the regions are overlapped. In the output process by the output section, results of the diagnosis process are outputted. Therefore, it is made possible to accurately compare physically abnormal portions with logically abnormal portions without using distance parameters since both the regions are determined to overlap or not, so that it is accurately determined whether or not physically abnormal regions cause logical abnormalities.

In a modification of the failure diagnosing system for the logic circuits according to the third embodiment of the present invention, the output process is realized by outputting and displaying the presence or absence of failure candidates having regions overlapped with defects in the diagnosis process, in different colors on physical positions of logic circuits at the time of manufacturing. Therefore, it is allowed to obtain as a distribution of physical positions of the logic circuits, whether or not defect causes are determined to be physical defects in the logic circuits causing logical abnormality, so that abnormal processes can be specified by referring to process names. Thus, it can be easily implemented to trace defect causes such as manufacturing variations.

FIG. 6 shows the output example. Physical defects are outputted and displayed in different colors on a logic circuit image at the time of manufacturing based on the presence or absence of failure candidates whose regions are overlapped with physical defects. The test process names or failure candidate layers may be specified by users so as to output and display the presence or absence of failure candidates whose regions are overlapped with physical defects in the specified processes or layers in different colors, Display color may also be changed based on the number of failure candidates whose regions are overlapped with physical defects. Moreover, in a plurality of regions divided from the logic circuit, colors may be outputted and displayed differently depending on positions of regions including the physical defects overlapped with the failure candidates. The change of display colors is aimed to realize easy visual recognition, and shapes, patterns, characters and numerical values may be alternatively used or used in combination with colors without limiting a display method to color differentiation.

Although the present invention has been described above in connection with several embodiments thereof, it will be appreciated by those skilled in the art that those embodiments are provided solely for illustrating the present invention, and should not be relied upon to construe the appended claims in a limiting sense.

What is claimed is:

1. A failure diagnosing method of logic circuits, comprising:
  (a) generating failure candidate data for plural failed logic circuits different from each other based on failure diagnosis data obtained from the logic circuits by using a failure diagnosis tool;
  (b) inputting the failure candidate data for the logic circuits;
  (c) extracting a predetermined data from each of the failure candidate data for the logic circuits;
  (d) diagnosing failures common to the plural failed logic circuits that are different from each other by collecting a name of each of the failure candidate data from the predetermined data and the number of failure candidate data; and
  (e) outputting the collected data on a display unit.

2. The failure diagnosing method according to claim 1, wherein said (e) outputting comprises:
  (e-1) determining a display color of each of a plurality of items of the failure candidate data based on the number of times that each of the plurality of items is set as the failure candidate in the (d) collecting;
  (e-2) generating a layout image such that each of the plurality of items is arranged on a layout design image for the logic circuits, and
  (e-3) displaying the layout image on the layout design image in the determined display color in a highlight display.

3. The failure diagnosing method according to claim 1, wherein said (e) outputting comprises:
- (e-1) determining a display color of each of a plurality of items of the failure candidate data based on the number of times that each of the plurality of items is set as the failure candidate in the (d) collecting;
- (e-2) generating a layout image such that each of the plurality of items is arranged on a layout design image for the logic circuits; and
- (e-4) displaying the layout image on a chip image for the logic circuits in the determined display color in a highlight display.

4. The failure diagnosing method according to claim 1, wherein said (c) extracting comprises:
- (c-1) extracting a name of a net as a set of wirings from the failure candidate data for the logic circuits; and
- (c-2) extracting a via sparse/dense data indicating via sparse/dense arrangement in the failure candidate net from the failure candidate data for the logic circuits;
said (d) diagnosing comprises;
- (d-1) classifying the failure candidate nets based on the via sparse/dense data; and
- (d-2) collecting the failure candidate data names and the number of failure candidate data for every failure candidate net name.

5. The failure diagnosing method according to claim 4, wherein said (e) outputting comprises:
- (e-5) determining a display color of the failure candidate net based on the via sparse/dense data by using the number of failure candidate data; and
- (e-6) displaying the failure candidate net on the layout design data image in the determined display color in a highlight display.

6. The failure diagnosing method according to claim 1, wherein the failure candidate data are provided for the different logic circuits of a same kind and have physical position data in manufacture, respectively,
said (e) outputting comprises:
- (e-7) counting the number of failure candidate data for every value of each of a plurality of items of the failure candidate data;
- (e-8) determining the display colors of the failure candidate data based on a maximum value of the counts; and
- (e-9) displaying the failure candidate data on a chip image for the logic circuits in the determined display colors in a highlight display.

7. The failure diagnosing method according to claim 1, wherein each of the failure candidate data contains a position data of each of chips on a wafer in manufacture, a failure candidate name, a failure candidate coordinate and a failure candidate layer,
a test resultant data contains the position data of each chip in manufacture, a failure information of a test process name and a failure coordinate, and a failure image,
process parameter contains a failure candidate layer of the failure candidate data and the test process name of the test resultant data corresponding to the failure candidate layer,
said (d) diagnosing comprises:
- (d-3) detecting a shape of a physical failure portion from a failure image and converting the detected shape of the physical failure portion into a polygon area;
- (d-4) determining coordinates of the polygon area by using the failure coordinate; and
- (d-5) referring to the failure candidate data, the test resultant data and the process parameter to determine whether a failure candidate area in the failure candidate layer corresponding to the test process name is coincident with the polygon area.

8. The failure diagnosing method according to claim 7, wherein said (e) outputting comprises:
- (e-10) determining a display color of each of the failure candidate data based on whether a physical failure portion corresponding to each of failure candidates for the failure candidate data is coincident with the polygonal area; and
- (e-11) outputting each of the failure candidates in the determined display color on a chip image.

9. A computer readable recording medium storing a program that, when executed by a computer, performs a failure diagnosing method which comprises:
- (a) generating failure candidate data for plural failed logic circuits different from each other based on failure diagnosis data obtained from the logic circuits;
- (b) inputting the failure candidate data for the logic circuits;
- (c) extracting a predetermined data from each of the failure candidate data for the logic circuits;
- (d) diagnosing failures common to the plural failed logic circuits that are different from each other by collecting a name of each of the failure candidate data from the predetermined data and the number of failure candidate data; and
- (e) outputting the collected data on a display unit.

10. The computer readable recording medium according to claim 9, wherein said (e) outputting comprises:
- (e-1) determining a display color of each of a plurality of items of the failure candidate data based on the number of times that each of the plurality of items is set as the failure candidate in the (d) collecting;
- (e-2) generating a layout image such that each of the plurality of items is arranged on a layout design image for the logic circuits; and
- (e-3) displaying the layout image on the layout design image in the determined display color in a highlight display.

11. The computer readable recording medium according to claim 9, wherein said (e) outputting comprises:
- (e-1) determining a display color of each of a plurality of items of the failure candidate data based on the number of times that each of the plurality of items is set as the failure candidate in the (d) collecting;
- (e-2) generating a layout image such that each of the plurality of items is arranged on a layout design image for the logic circuits; and
- (e-4) displaying the layout image on a chip image for the logic circuits in the determined display color in a highlight display.

12. The computer readable recording medium according to claim 9, wherein each of the failure candidate data contains a position data of each of chips on a water in manufacture, a failure candidate name, a failure candidate coordinate and a failure candidate layer,
a test resultant data contains the position data of each chip in manufacture, a failure information of a test process name and a failure coordinate, and a failure image,
process parameter contains a failure candidate layer of the failure candidate data and the test process name of the test resultant data corresponding to the failure candidate layer,
said (d) diagnosing comprises:

(d-3) detecting a shape of a physical failure portion from a failure image and converting the detected shape of the physical failure portion into a polygon area;

(d-4) determining coordinates of the polygon area by using the failure coordinate; and (d-5) referring to the failure candidate data, the test resultant data and the process parameter to determine whether a failure candidate area in the failure candidate layer corresponding to the test process name is coincident with the polygon area.

13. The computer readable recording medium according to claim 12, wherein said (e) outputting comprises:

(d-6) determining the display color of each of the failure candidates based on whether the physical failure portion for each of the failure candidates is on the polygon area; and (d-7) displaying each of the failure candidates on a chip image in the determined display color.

14. A failure diagnosing method of logic circuits, comprising:

(a) generating failure candidate data for plural failed logic circuits different from each other based on failure diagnosis data obtained from the logic circuits by using a failure diagnosis tool;

(b) inputting the failure candidate data for the logic circuits;

(c) extracting a predetermined data from each of the failure candidate data for the logic circuits;

(d) diagnosing failures common to the plural failed logic circuits that are different from each other; and (e) outputting data on a display unit, wherein said (c) extracting comprises:

(c-1) extracting a failure candidate name and a coordinate of the failure candidate, a failure candidate layer of a layout wiring layer or manufacturing processes, a failure candidate wiring branch data from the failure candidate data for each of the logic circuits, said (d) diagnosing comprises:

(d-1) extracting an OPEN failure candidate layer as a layer of the failure occurring due to disconnection from the failure candidate data by using said failure candidate layer; and (d-2) extracting an SHORT failure candidate layer as a layer of the failure occurring due to short-circuit from the failure candidate data by using said failure candidate layer, said (e) outputting comprises:

(e-1) outputting the OPEN candidate layer and the SHORT candidate layer for each of the failure candidate data; and (e-2) outputting a failure type, and the number of failure candidates or the number of overlapping failures.

15. The failure diagnosing method according to claim 14, wherein said (c) extracting further comprises:

(c-2) extracting a coordinate of each of the failure candidates, said (d) diagnosing comprises:

(d-3) extracting the OPEN candidate layer and the SHORT candidate layer by using the failure candidate layer and said failure candidate wiring data, said (d-3) extracting comprises:

(d-3-a) extracting the failure candidate layer which contains a portion of a wiring as the OPEN candidate layer;

(d-3-b) extracting the failure candidate layer which contains a pair of wirings as the SHORT candidate layer;

(d-3-c) extracting the failure candidate layer which contains a cell as the OPEN candidate layer and the SHORT candidate layer; and (d-3-d) extracting the failure candidate layer which contains a gate as the OPEN candidate layer and the SHORT candidate layer.

16. The failure diagnosing method according to claim 14, wherein each of the failure candidate data has physical position data of the chip containing the logic circuits on the wafer in manufacture, and said (e) outputting comprises:

displaying the OPEN candidate layer and the SHORT candidate layer for the failure candidate data in display colors as a physical distribution.

17. The failure diagnosing method according to claim 14, wherein each of the failure candidate data has physical position data of the chip containing the logic circuits on the wafer in manufacture, and said (e) outputting comprises:

displaying the failure type, the number of failure candidates or the number of overlapping candidates for the failure candidate data in display colors as a physical distribution.

18. The failure diagnosing method according to claim 14, further comprising:

(f) ordering between said (d) diagnosing and said (e) outputting, wherein said (f) ordering comprises:

(f-1) counting the number of OPEN candidate layers to each of the failure candidate data;

(f-2) counting the number of SHORT candidate layers to each of the failure candidate data;

(f-3) ordering the failure candidate data based on the counts of the OPEN candidate layers after said (f-1) counting; and (f-4) ordering the failure candidate data based on the counts of the SHORT candidate layers after said (f-2) counting, and said (e) outputting comprises:

(e-3) outputting the failure candidate name and the order of the OPEN candidate layer for each of the failure candidate data; and (e-4) outputting the failure candidate name and the order of the SHORT candidate layer for each of the failure candidate data.

19. The failure diagnosing method according to claim 18, wherein said (c) extracting comprises:

(c-2) acquiring a coordinate of the failure candidate, said (d) diagnosing comprises:

(d-3) extracting the OPEN candidate layer and the SHORT candidate layer for each of the failure candidate data by using the failure candidate layer and the failure candidate wiring data;

said (d-3) extracting comprises:

(d-3-a) extracting the failure candidate layer which contains a portion of a wiring as the OPEN candidate layer;

(d-3-b) extracting the failure candidate layer which contains a pair of wirings as the SHORT candidate layer;

(d-3-c) extracting the failure candidate layer which contains a cell as the OPEN candidate layer and the SHORT candidate layer; and (d-3-d) extracting the failure candidate layer which contains a gate as the OPEN candidate layer and the SHORT candidate layer.

20. A computer readable software product that, when executed by a computer, performs a failure diagnosing method, the method comprising:

(a) generating failure candidate data for plural failed logic circuits different from each other based on failure diagnosis data obtained from the logic circuits by using a failure diagnosis tool;

(b) inputting the failure candidate data for the logic circuits;

(c) extracting a predetermined data from each of the failure candidate data for the logic circuits;

(d) diagnosing failures common to the plural failed logic circuits that are different from each other; and (e) outputting data on a display unit, wherein said (c) extracting comprises;

(c-1) extracting a failure candidate name and a coordinate of the failure candidate, a failure candidate layer of a layout wiring layer or manufacturing processes, a failure candidate wiring branch data from the failure candidate data for each of the logic circuits, said (d) diagnosing comprises:

(d-1) extracting an OPEN failure candidate layer as a layer of the failure occurring due to disconnection from the failure candidate data by using said failure candidate layer; and (d-2) extracting an SHORT failure candidate layer as a layer of the failure occurring due to short-circuit from the failure candidate data by using said failure candidate layer, said (e) outputting comprises:

(e-1) outputting the OPEN candidate layer and the SHORT candidate layer for each of the failure candidate data; and (e-2) outputting a failure type, and the number of failure candidates or the number of overlapping failures.

21. The computer readable software product according to claim 20, wherein said (c) detecting further comprises;

(c-2) extracting a coordinate of each of the failure candidates, said (d) diagnosing comprises:

(d-3) extracting the OPEN candidate layer and the SHORT candidate layer by using the failure candidate layer and said failure candidate wiring data, said (d-3) extracting comprises:

(d-3-a) extracting the failure candidate layer which contains a portion of a wiring as the OPEN candidate layer;

(d-3-b) extracting the failure candidate layer which contains a pair of wirings as the SHORT candidate layer;

(d-3-c) extracting the failure candidate layer which contains a cell as the OPEN candidate layer and the SHORT candidate layer; and (d-3-d) extracting the failure candidate layer which contains a gate as the OPEN candidate layer and the SHORT candidate layer.

22. The computer readable software product according to claim 20, wherein each of the failure candidate data has physical position data of the chip containing the logic circuits on the wafer in manufacture, and said (e) outputting comprises:

displaying the OPEN candidate layer and the SHORT candidate layer for the failure candidate data in display colors as a physical distribution.

23. The computer readable software product according to claim 20, wherein each of the failure candidate data has physical position data of the chip containing the logic circuits on the wafer in manufacture, and said (e) outputting comprises:

displaying the failure type, the number of failure candidates or the number of overlapping candidates for the failure candidate data in display colors as a physical distribution.

24. The computer readable software product according to claim 20, wherein said failure diagnosing method further comprises:

(f) ordering between said (d) diagnosing and said (e) outputting, wherein said (f) ordering comprises:

(f-1) counting the number of OPEN candidate layers to each of the failure candidate data;

(f-2) counting the number of SHORT candidate layers to each of the failure candidate data;

(f-3) ordering the failure candidate data based on the counts of the OPEN candidate layers after said (f-1) counting; and (f-4) ordering the failure candidate data based on the counts of the SHORT candidate layers after said (f-2) counting, and said (e) outputting comprises:

(e-3) outputting the failure candidate name and the order of the OPEN candidate layer for each of the failure candidate data; and (e-4) outputting the failure candidate name and the order of the SHORT candidate layer for each of the failure candidate data.

25. The computer readable software product according to claim 24, wherein said (c) extracting comprises:

(c-2) acquiring a coordinate of the failure candidate, said (d) diagnosing comprises:

(d-3) extracting the OPEN candidate layer and the SHORT candidate layer for each of the failure candidate data by using the failure candidate layer and the failure candidate wiring data;

said (d-3) extracting comprises:

(d-3-a) extracting the failure candidate layer which contains a portion of a wiring as the OPEN candidate layer;

(d-3-b) extracting the failure candidate layer which contains a pair of wirings as the SHORT candidate layer;

(d-3-c) extracting the failure candidate layer which contains a cell as the OPEN candidate layer and the SHORT candidate layer; and (d-3-d) extracting the failure candidate layer which contains a gate as the OPEN candidate layer and the SHORT candidate layer.

* * * * *